US012751096B2

(12) United States Patent
Denbaars et al.

(10) Patent No.: US 12,751,096 B2
(45) **Date of Patent: *Sep. 29, 2026**

(54) SOLAR BLIND SOLID STATE GALLIUM CONTAINING PHOTODIODE DEVICE AND RELATED METHOD

(71) Applicant: Palomino Laboratories, Inc., Palo Alto, CA (US)

(72) Inventors: Steven P. Denbaars, Palo Alto, CA (US); Dalton Eng-Denbaars, Palo Alto, CA (US)

(73) Assignee: Palomino Laboratories, Inc., Palo Alto, CA (US)

( * ) Notice: Subject to any disclaimer, the term of this patent is extended or adjusted under 35 U.S.C. 154(b) by 55 days.

This patent is subject to a terminal disclaimer.

(21) Appl. No.: 18/737,354

(22) Filed: Jun. 7, 2024

(65) Prior Publication Data

US 2024/0372026 A1 Nov. 7, 2024

Related U.S. Application Data

(63) Continuation of application No. 18/312,456, filed on May 4, 2023, now Pat. No. 12,027,642.

(51) Int. Cl.

*H10F 30/223* (2025.01)
*H10F 71/00* (2025.01)

(Continued)

(52) U.S. Cl.

CPC ....... *H10F 30/223* (2025.01); *H10F 71/1274* (2025.01); *H10F 71/1276* (2025.01); *H10F 77/12485* (2025.01); *H10F 77/148* (2025.01); *H10F 77/169* (2025.01); *H10F 77/413* (2025.01)

(58) Field of Classification Search

CPC ............... H10F 30/223; H10F 71/1274; H10F 71/1276; H10F 77/12485; H10F 77/148;

(Continued)

(56) References Cited

U.S. PATENT DOCUMENTS

| | | | |
|---|---|---|---|
| 8,072,584 | B2 | 12/2011 | Caldwell et al. |
| 2012/0179376 | A1 | 7/2012 | O'Brien et al. |

(Continued)

OTHER PUBLICATIONS

Wang, Guo-Sheng et al. âHigh Quantum Efficiency Back-Illuminated AlGaN-Based Solar-Blind Ultraviolet pin Photodetectors.â Chinese physics letters 29.9 (2012): 97302-1-097302â4. Web (Year: 2012).*

(Continued)

*Primary Examiner* — Monica T Taba

(74) *Attorney, Agent, or Firm* — Richard T. Ogawa; Ogawa P.C.

(57) ABSTRACT

According to the present invention, techniques related generally to a photodiode device configured to be receptive to a near ultraviolet (UV-C) emission wavelength range. This wavelength range is specifically designed to be immune to background radiation produced by the Sun, rendering the communication device Solar Blind, and immune to other similar forms of interference. In particular, the present invention provides a light receiving and sensing system using various compositional Al, Ga, Sc, and N solid state materials to detect and measure radiation with a high degree of fidelity. This invention has numerous applications not only in detection and sensing technologies, but also measurement, communication, navigation, and other related aspects.

20 Claims, 8 Drawing Sheets

(51) Int. Cl.
*H10F 77/124* (2025.01)
*H10F 77/14* (2025.01)
*H10F 77/169* (2025.01)
*H10F 77/40* (2025.01) .

(58) Field of Classification Search
CPC .. H10F 77/169; H10F 77/413; H10F 77/1243; H01L 21/0254
See application file for complete search history.

(56) References Cited

U.S. PATENT DOCUMENTS

| | | | |
|---|---|---|---|
| 2015/0247953 | A1 | 9/2015 | O'Brien et al. |
| 2019/0302141 | A1 | 10/2019 | Caldwell et al. |

OTHER PUBLICATIONS

Haojun Zhang et al. "Continuous-wave operation of a semipolar InGaN distributed-feedback blue laser diode with a first-order indium tin oxide surface grating", Optics Letters, Jun. 15, 2019, vol. 44, No. 12, https://doi.org/10.1364/OL.44.003106.
Patrick Vrancken et al. "Airborne forward-pointing UV Rayleigh lidar for remote clear air turbulence detection: system design and performance", Applied Optics, Nov. 10, 2016,vol. 55, No. 32, http://dx.doi.org/10.1364/AO.55.009314.
Qing Cai et al. "Progress on AlGaN-based solar-blind ultraviolet photodetectors and focal plane arrays", 2021, Light: Science & Applications, Official journal of the CIOMP 2047-7538.

* cited by examiner

SOLAR BLIND SOLID STATE GALLIUM CONTAINING PHOTODIODE DEVICE AND RELATED METHOD

RELATED APPLICATIONS

This application is a Continuation of U.S. Ser. No. 18/312,456 filed May 4, 2023, commonly assigned, and hereby incorporated by reference in its entirety. This application is related to U.S. Ser. No. 18/300,332 filed Apr. 13, 2023, commonly assigned, and hereby incorporated by reference in its entirety.

BACKGROUND OF INVENTION

Photodetector sensors are electronic devices that detect and measure the intensity of light. Photodetector sensors are commonly used in a variety of applications, including optical communication, scientific research, and industrial sensing. Photodetectors are designed to interact with light, so they are naturally suited for use with sunlight.

One of the most common uses of photodetectors in relation to sunlight is in solar energy systems. Photovoltaic cells, which are a type of photodetector, convert sunlight into electricity by absorbing photons and releasing electrons. The photovoltaic cells are commonly used in solar panels to generate renewable energy.

Another use of photodetectors with sunlight is in the field of remote sensing. Photodetectors can be used in satellite and airborne imaging systems to gather data on land use, climate, and weather patterns. They can also be used in environmental monitoring systems to measure air and water quality.

Solar blind sensors, on the other hand, are a type of photodetector that only respond to UV-C light, which is not present in sunlight due to absorption by the Earth's atmosphere. Wavelengths shorter than 285 nm are completely absorbed by the Earth's zone layer, so there is no interference from sunlight. This makes solid blind sensors ideal for applications where sunlight interference is a concern, such as in flame detection systems, free space communications or sterilization equipment.

The main improvement of using solar blind sensors is that they are less sensitive to sunlight and other sources of visible light, which can interfere with the accuracy of measurements made by conventional photodetectors. They can also detect UV-C radiation more accurately and reliably, which makes them suitable for use in a wider range of applications.

However, one drawback of solar blind sensors is that they are more expensive to manufacture than conventional photodetectors. Additionally, because they only respond to UV-C radiation, they may not be suitable for applications where detection of other wavelengths of light is necessary.

SUMMARY OF INVENTION

In an example, the present invention provides a solar blind light AlGaN photodetector device configured to detect electromagnetic radiation having a wavelength, e.g., shorter than 285 nm, among others. In an example, the device comprises a substrate member comprising a sapphire, silicon, silicon carbide, gallium and nitride containing substrate member. The substrate member has a backside region and a frontside region. In an example, the device has an aperture region configured from the backside region. In an example, the aperture region is transparent to electromagnetic radiation ranging in wavelength from less than 280 nanometers.

In an example, the device has a defect reducing nucleation or buffer material overlying the frontside region of the substrate member. The device has an n-type aluminum and gallium nitride containing cladding material overlying the defect reducing nucleation or buffer material overlying the frontside region of the substrate member and a first compositionally graded AlGaN containing interconnecting material overlying the n-type aluminum and gallium nitride containing cladding material.

In an example, the device has an intrinsic light detecting region having a bandgap of larger than 4.35 eV (for shorter than 285 nm, as an example). The intrinsic light detecting region ranges in thickness from 100 nanometers to 1 micron or greater overlying the first compositionally graded AlGaN containing interconnecting material. The intrinsic light detecting region comprises an aluminum gallium scandium nitride material. The device has an undoped region characterizing the intrinsic light detecting region. Preferably, the undoped region is intentionally undoped, where dopant species are not introduced into such intrinsic light region.

In a preferred example, presence of the scandium in the aluminum gallium scandium nitride material causes formation of a latticed matched structure that is substantially free from imperfections, e.g., cracks, mis-match, and other defects, that may lead to electronic and reliability issues.

In an example, the device has a second compositionally graded AlGaN containing interconnecting material overlying the intrinsic light detecting region and a p-type aluminum and gallium nitride containing cladding material overlying the intrinsic light detecting region. The device has a contact region overlying the p-type gallium and nitrogen cladding material.

In an example, a signal to noise ratio of greater than 100 to 1 characterizes the device such that an electromagnetic radiation received by the aperture region being free from interference with solar radiation. In an example, an operating temperature range of 10 Degrees Kelvin to 500 Degrees Kelvin characterizes the device. The device has an optical lens material overlying the aperture region.

Of course, one of ordinary skill in the art would recognize other variations, modifications, and alternatives.

Depending upon the example, the present invention can achieve one or more of these benefits and/or advantages. In an example, the present invention provides a correction technique using a distributed feedback (DFB) laser device and solar blind sensor configured as a light ranging and detection system. In an example, the present invention offers advantage of size weight and cost reduction for solar blind sensors. In an example, the invention provides for multiple smaller sensors capable to be externally mounted, and other benefits. In an example, the present solar blind photodetector device is capable of receiving electromagnetic signals in a wavelength range without interference from other radiation in an efficient manner. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF EXAMPLES

Figure 1:
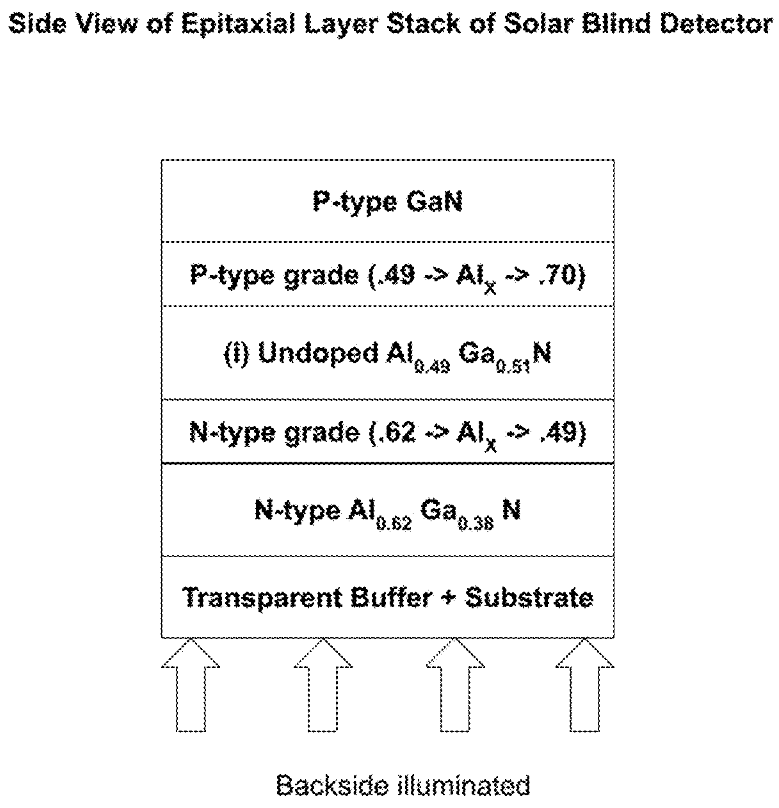
FIG. 1 is a simplified cross-sectional view diagram of a solar blind photodetector device according to an example of the present invention.

In the following description of a preferred example, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

As further background, conventional solar blind sensors are typically based on two types of technologies: photomultiplier tubes (PMTs) and solid-state sensors.

PMTs are vacuum tubes that contain a photocathode and a series of electrodes. When UV-C photons strike the photocathode, they release electrons, which are then accelerated towards the electrodes. This creates a cascade effect, where the number of electrons increases exponentially as they are accelerated through the tube. PMTs are highly sensitive and can detect very low levels of UV-C radiation, but they are also expensive, fragile, and require high voltage power supplies.

Solid-state sensors, on the other hand, use semiconductor materials to detect UV-C radiation. These sensors typically made with silicon and consist of a p-n junction, where the p-type and n-type materials are doped to produce a depletion region. When UV-C photons strike the depletion region, they generate electron-hole pairs, which produce a current that can be measured. Solid-state sensors are more compact and less expensive than PMTs, but they are also less sensitive and can be affected by temperature and humidity.

One major drawback of conventional solar blind sensors is their limited spectral range. They are designed to detect only UV-C radiation, which has a wavelength of 100-280 nm. This means that they cannot detect other wavelengths of light that may be present in the environment, such as visible light or UV-A and UV-B radiation. This can limit their usefulness in some applications, such as in biotechnology or environmental monitoring, where detection of a broader range of wavelengths is necessary.

Another drawback of conventional solar blind sensors is their susceptibility to interference from background radiation. Cosmic rays, radioactive decay, and other sources of ionizing radiation can generate false signals in the sensors, which can affect their accuracy and reliability. This can be particularly problematic in applications that require precise measurements or where the presence of low-level radiation is a concern, such as in nuclear power plants or space exploration.

In an example, the present invention provides a solid-state solar blind sensor device, and method of manufacture. In an example, the present solid-state solar blind sensors are based on the use of semiconductor materials that are sensitive to UV-C radiation. These sensors typically use a p-n junction, which is a boundary between p-type and n-type semiconductor materials, to detect the radiation. When a UV-C photon strikes the depletion region of the p-n junction, it generates electron-hole pairs, which create a current that can be measured.

The semiconductor materials used in solid-state solar blind sensors are typically silicon carbide (SiC) or gallium nitride (GaN). These materials have a wide bandgap, which allows them to absorb UV-C radiation but not visible or infrared radiation. SiC is commonly used in high-temperature and high-power applications, while GaN is used in low-power and high-frequency applications.

The manufacturing process for solid-state solar blind sensors involves several steps, including crystal growth, wafer processing, and device fabrication. The crystal growth process involves growing large, high-quality crystals of SiC or GaN using techniques such as chemical vapor deposition or physical vapor deposition. The wafer processing step involves cutting the crystals into thin wafers and polishing them to create a flat and smooth surface. The device fabrication step involves adding impurities to the semiconductor materials to create p-type and n-type regions, and then using lithography and etching techniques to pattern the materials into the desired shapes and structures.

In an example, the present solid-state solar blind sensors are capable of detecting in a certain spectral range. They are designed to detect only UV-C radiation, which has a wavelength of 100-280 nm. This means that they cannot detect other wavelengths of light that may be present in the environment, such as visible light or UV-A and UV-B radiation, which limits any interference from other wavelengths.

In an example, the present gallium nitride (GaN) based solar blind sensors and transmitters can be made using a variety of techniques, including metal-organic chemical vapor deposition (MOCVD), molecular beam epitaxy (MBE), and hydride vapor phase epitaxy (HVPE). These techniques involve depositing layers of GaN onto a substrate, which can be a silicon wafer or a sapphire wafer.

In MOCVD, a metal-organic precursor and a nitrogen-containing gas are introduced into a reactor chamber, where they react to produce a GaN film on the substrate. This technique is commonly used for large-scale production of GaN-based devices and can produce high-quality films with good uniformity and reproducibility.

In MBE, a GaN film is deposited by evaporating a solid source of GaN onto the substrate in a high vacuum. This technique allows for precise control over the thickness and composition of the GaN film, but it can be time-consuming and expensive.

In HVPE, a GaN film is deposited by reacting gallium chloride and ammonia in a high-temperature reactor. This technique is relatively low-cost and can produce high-quality GaN films with good crystal quality, but it requires careful control of the reaction conditions.

Once the GaN film has been deposited onto the substrate, it can be patterned and processed into a solar blind sensor or transmitter using standard microfabrication techniques such as lithography, etching, and metallization.

Advantages of GaN-based solar blind sensors and transmitters include their high sensitivity, radiation hardness, fast response time, and low noise. GaN has a wide bandgap, which allows it to detect UV-C radiation while rejecting visible and infrared radiation. This makes GaN-based sensors and transmitters well-suited for applications where solar radiation or other sources of background radiation are present.

Additionally, GaN-based sensors and transmitters have a high power-handling capability, which makes them suitable for high-power applications such as UV-C disinfection or curing. They also have good thermal stability and can operate at high temperatures, which makes them useful in harsh environments.

Overall, GaN-based solar blind sensors and transmitters offer a promising solution for applications that require high sensitivity and fast response time to UV-C radiation, such as in biotechnology, environmental monitoring, and aerospace.

FIG. 1 is a simplified cross-sectional view diagram of a solar blind photodetector device according to an example of the present invention. As shown, the device has a substrate that includes a front side and a back side. The back side is subject to illumination by electromagnetic radiation. In an example, the substrate has a transparent buffer region, as shown. In an example, the substrate has an overlying n type aluminum gallium and nitrogen containing material, e.g., AlGaN. In an example, the device has a compositionally graded n type AlGaN material overlying the n type AlGaN material. The device further has an undoped (e.g., intentionally undoped) AlGaN material, and an overlying compositionally graded p-type material. The device has an overlying p type GaN material. In an example, the p-type GaN material and n type AlGaN material are configured as interconnect regions. Further details of the device are found throughout the present specification and more particularly below.

In an example, a compositionally graded AlGaN containing interconnecting material is composed of aluminum (Al), gallium (Ga), and nitrogen (N) and has a graded composition where the percentage of Al and Ga varies along the thickness of the material. In an example, the interconnecting material refers to the material that is used to connect different regions of the device together, as shown. In an example, the interconnecting material is made of the same compositionally graded AlGaN material as the rest of the device or variations of such material. In an example, grading of the composition in the AlGaN material is achieved by gradually changing the ratio (or fraction) of Al to Ga as the material is grown. This allows for the precise control of the properties of the material, such as its bandgap and conductivity, which are desirable for device performance.

Preferably, the interconnecting material ensures that the device operates efficiently and reliably. In an example, the compositionally graded AlGaN containing interconnecting material is capable to withstand high temperatures and provide a low-resistance connection between different regions of the device.

In an example, the present technique uses various compounds of gallium nitride. In an example, gallium nitride (GaN), aluminum gallium nitride (AlGaN), indium gallium nitride (InGaN), and aluminum indium gallium nitride (AlInGaN) are included. In an example, such gallium nitride compound semiconductors can be formed in an undoped, p-type, and n-type doped states.

In an example, undoped GaN, AlGaN, InGaN, and AlInGaN can be formed using various methods such as molecular beam epitaxy (MBE), metal-organic chemical vapor deposition (MOCVD), or hydride vapor phase epitaxy (HVPE). In MBE, the material is grown by depositing individual atoms or molecules on a substrate in a high vacuum environment. In MOCVD, a mixture of metal-organic precursors and nitrogen gas is used to deposit the material on a substrate. In HVPE, a mixture of halide gases and ammonia gas is used to deposit the material on a substrate. The undoped material has a high electron mobility and can be used for high-power and high-frequency devices.

In an example, to make p-type GaN, AlGaN, InGaN, and AlInGaN, impurities such as magnesium (Mg) or zinc (Zn) are introduced during the growth process. These impurities act as acceptors and create holes in the valence band, which results in a material with a positive charge carrier concentration. To make n-type GaN, AlGaN, InGaN, and AlInGaN, impurities such as silicon (Si) or oxygen (O) are introduced during the growth process. These impurities act as donors and create extra electrons in the conduction band, which results in a material with a negative charge carrier concentration.

In an example, techniques for forming various gallium nitride materials use commonly used precursor gases for depositing these materials. For MOCVD, commonly used precursors for gallium include trimethylgallium (TMGa) and triethylgallium (TEGa), while ammonia (NH3) is typically used as the nitrogen source. For MBE, elemental gallium and nitrogen are typically used as the source materials. To deposit AlGaN, TMGa or TEGa can be used as the source of gallium, while trimethylaluminum (TMA) or triethylaluminum (TEA) can be used as the source of aluminum. The aluminum and gallium precursors are typically mixed in a specific ratio to achieve the desired aluminum composition in the material. For InGaN, TMGa, TEGa, and trimethylindium (TMIn) can be used as the source of gallium and indium, while NH3 is used as the nitrogen source. The composition of InGaN can be varied by adjusting the ratio of TMGa, TEGa, and TMIn. To deposit AlInGaN, TMGa, TEGa, TMA, and TEA can be used as the sources of gallium and aluminum, while TMIn can be used as the source of indium. The composition of AlInGaN can be varied by adjusting the ratio of the precursors. In addition to these precursors, other gases such as hydrogen (H2) or nitrogen (N2) can be used as carrier gases or to modify the growth conditions. Of course, one of ordinary skill in the art would recognize other variations, modifications, and alternatives.

As used herein, the terms "Group-III nitrides" or "III-nitrides" or "nitrides" as used herein refer to any alloy composition of the (Ga, Al, In, B) N semiconductors having the formula $Ga_nAl_xIn_yB_zN$ where $0 \le n \le 1$, $0 \le x \le 1$, $0 \le y \le 1$, $0 \le z \le 1$, and $n+x+y+z=1$. These terms as used herein are intended to be broadly construed to include respective nitrides of the single species, Ga, Al, In and B, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (Ga, Al, In, B) N component species are present, all possible compositions, including stoichiometric proportions as well as off-stoichiometric proportions (with respect to the relative mole fractions present of each of the (Ga, Al, In, B) N component species that are present in the composition), can be employed within the broad scope of this invention. Further, compositions and materials within the scope of the invention may further include quantities of dopants and/or other impurity materials and/or other inclusion materials.

Figure 2:
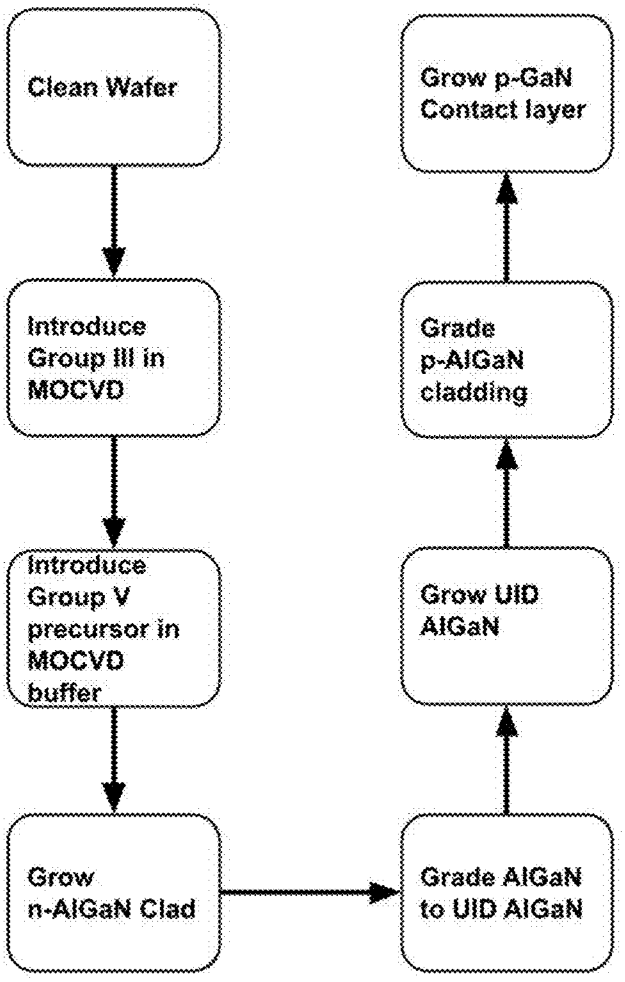
FIG. 2 is a simplified diagram of a method of manufacturing a solar blind photodetector device according to an example of the present invention.

FIG. 2 is a simplified diagram of a method of manufacturing a solar blind photodetector device according to an example of the present invention. As shown, the method includes steps of cleaning a substrate. Once the substrate has been cleaned, the substrate is placed in a MOCVD reactor configured for a MOCVD process. In an example, Group III reactants are introduced into the reactor, and then Group V reactants are introduced into the reactor. Such reactants are introduced to form an n type AlGaN cladding material overlying the substrate. The composition of the reactants is changed to compositionally graded AlGaN material until formation of an undoped intrinsic AlGaN region. Next, the composition of the reactants is changed again to form a compositionally graded p type AlGaN cladding region. The method includes formation of a contact region using growth of a p type GaN contact region. Further details of the present method can be found throughout the present specification and more particularly below.

In an example, the present invention provides a method of fabricating a solar blind light AlGaN photodetector device configured to detect electromagnetic radiation having a wavelength less than 285 nm. The method includes providing a substrate member comprising a sapphire, silicon, silicon carbide, gallium and nitride containing substrate member. In an example, the substrate member has a backside region and a frontside region such that the backside is configured as an aperture region, the aperture region being transparent to electromagnetic radiation ranging in wavelength less than 280 nanometers or other ranges, which are solar blind. Such ranges would not interference with radiation emitted from the sun.

In an example, the method includes forming a defect reducing nucleation or buffer material using a MOCVD process. The MOCVD process uses a group III gaseous precursor introduced before the group V precursor process overlying the frontside region of the substrate member. In an example, the defect reducing nucleation or buffer material comprises an AlN material having a thickness ranging from 1 nm to 20 nm. Such buffer or nucleation material facilitates formation of overlying materials.

In an example, the method includes forming an n-type aluminum and gallium nitride containing cladding material overlying the defect reducing nucleation or buffer material overlying the frontside region of the substrate member. The n-type aluminum and gallium nitride containing cladding material comprises a silicon or germanium dopant having a concentration ranging from 1E+16 cm-3 to 1E+20 cm-3 and a thickness ranging from 10 nm to 5000 nm.

In an example, the method includes forming a first compositionally graded AlGaN containing interconnecting material using a MOCVD process at a temperature ranging from 800 C to 1400 C overlying the n-type aluminum and gallium nitride containing cladding material having an aluminum composition ranging from 90% to 60% from an initial region to a final region, and a thickness ranging from 1 nm to 50 nm.

In an example, the method includes forming an intrinsic light detecting region using a MOCVD process at a temperature ranging from 800 C to 1400 C having a bandgap of larger than 4.35 eV (for detecting shorter than 285 nm wavelength, for example). The intrinsic light detecting region ranges in thickness from 100 nanometers to 1 micron or greater and is overlying the first compositionally graded AlGaN containing interconnecting material. In an example, the intrinsic light detecting region comprises an aluminum gallium scandium nitride material and configured with an undoped region characterizing the intrinsic light detecting region.

In an example, the method includes forming a second compositionally graded AlGaN containing interconnecting material using a MOCVD process. The MOCVD process is characterized by a temperature ranging from 800 C to 1400 C. The interconnecting material is overlying the intrinsic light detecting region and has a composition of aluminum ranging from 65% to 0% from an initial region to a final region, and a thickness ranging from 1 nm to 50 nm.

In an example, the method includes forming a p-type gallium nitride containing cladding material using a MOCVD process having a temperature of 800 C to 1400 C overlying the intrinsic light detecting region. In an example, the p-type aluminum and gallium nitride containing cladding material comprises a p-type dopant having a concentration ranging from 1E+16 cm-3 to 2E+20 cm-3, and a thickness ranging from 1 nm to 100 nm.

In an example, the method includes forming a contact region overlying the p-type gallium and nitrogen cladding material, the contact region comprising a MOCVD deposited material having a dopant of p-type at a concentration ranging from 1E+16 cm-3 to 2E+20 cm-3, and a thickness ranging from 1 nm to 100 nm.

In an example, the method includes coupling an optical lens material comprising an inorganic material overlying the aperture region and having a transparency of 25% and greater for a wavelength ranging from 285 nm to 250 nm.

Figure 3:
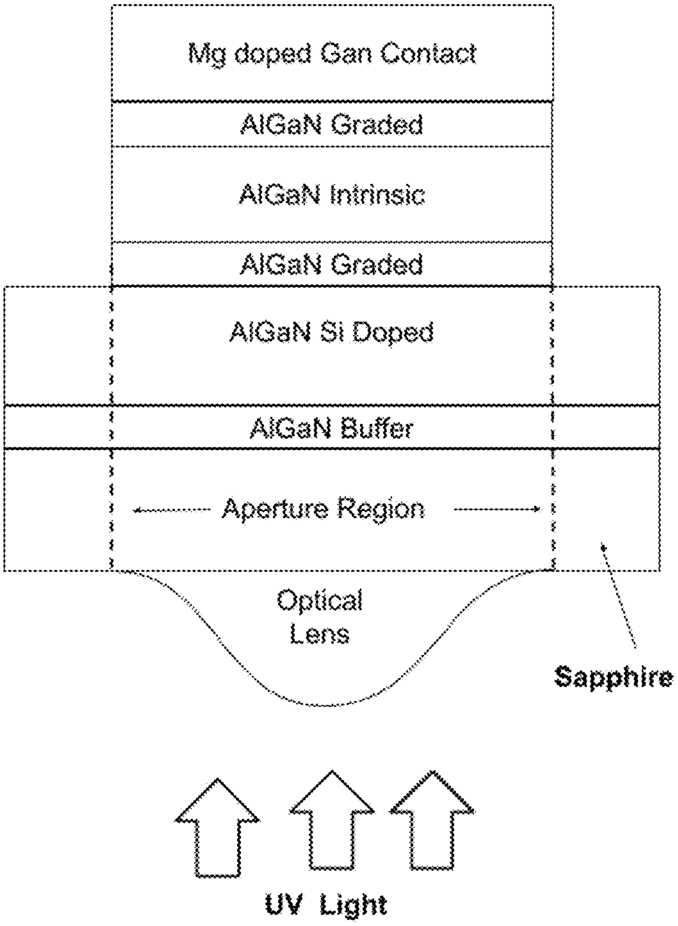
FIG. 3 is a simplified cross-sectional view diagram of for a solar blind photodetector device including buffers, substrates, and aperture region according to an example of the present invention.

FIG. 3 is a simplified cross-sectional view diagram of for a solar blind photodetector device including buffers, substrates, and aperture region according to an example of the present invention. As shown, the device has an optical lens coupled to a substrate, e.g., sapphire. The substrate forms an aperture region, which receives electromagnetic radiation in the form of ultra violet light. The device has an overlying AlGaN buffer material, which is grown overlying a surface of the substrate. The device has an n type AlGaN material overlying the buffer material. A compositionally graded n-type AlGaN material is overlying the n type AlGaN material. The device has an intrinsic region made of AlGaN material overlying the compositionally graded n type AlGaN material. The device has another compositionally graded AlGaN material, which is p type. The device has a p type GaN contact material comprising a magnesium dopant overlying the compositionally graded material.

Figure 4:
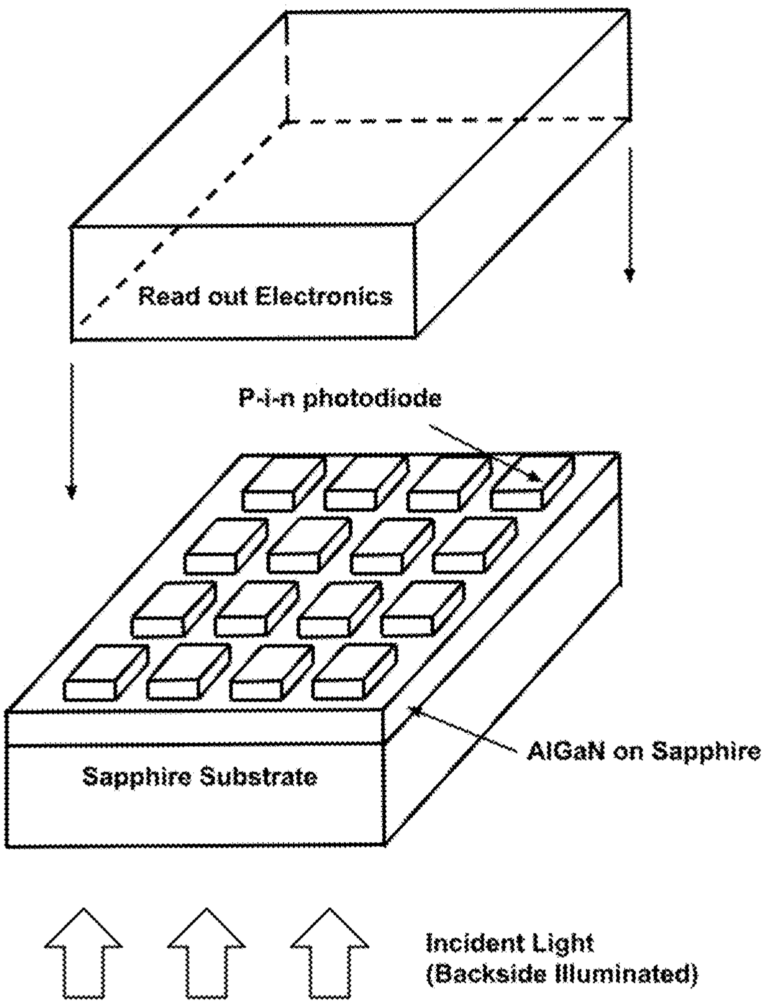
FIG. 4 is a simplified diagram of a solar blind photodetector device mounted onto to a silicon read out integrated circuit (ROIC) for a focal plane array according to an example of the present invention.

FIG. 4 is a simplified diagram of a solar blind photodetector device mounted onto to a silicon read out integrated circuit (ROIC) for a focal plane array according to an example of the present invention. As shown, the diagram includes an array of solar blind photodetector devices. The devices for an N by M array, where N is two and greater, and M is two and greater, although N or M can also be one. Each of the devices has a contact region, which is exposed. The contact region is bonded to a read out circuit to form a focal plane array.

Figure 5:
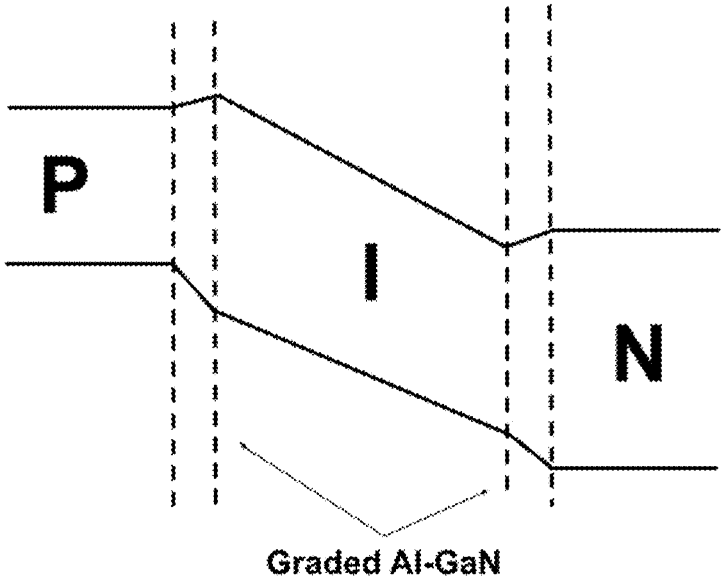
FIG. 5 is a simplified diagram of a P-I-N band diagram of a solar blind photo detector device with graded aluminum interlayers according to an example of the present invention.

FIG. 5 is a simplified diagram of a P-I-N band diagram of a solar blind photo detector device with graded aluminum interlayers according to an example of the present invention. As shown, the device has a AlGaN p region, a compositionally graded region, an intrinsic region, a compositionally graded region, and an n type AlGaN region to form a sandwich structure. In an example, the n type region can have a fraction of aluminum of 0.62 to a fraction of gallium at 0.38. In the compositionally graded n-type region the fraction of aluminum begins at 0.62 to 0.49 relative to gallium. The composition in the intrinsic region begins at 0.49 and remains at 0.49, while gallium is at 0.51. At the p-type compositionally graded region the aluminum begins at 0.49 at an interface between the intrinsic region and the p-type compositionally graded region to increases to 0.70 at an interface between the p-type compositionally graded region to the p-type contact region.

Figure 6:
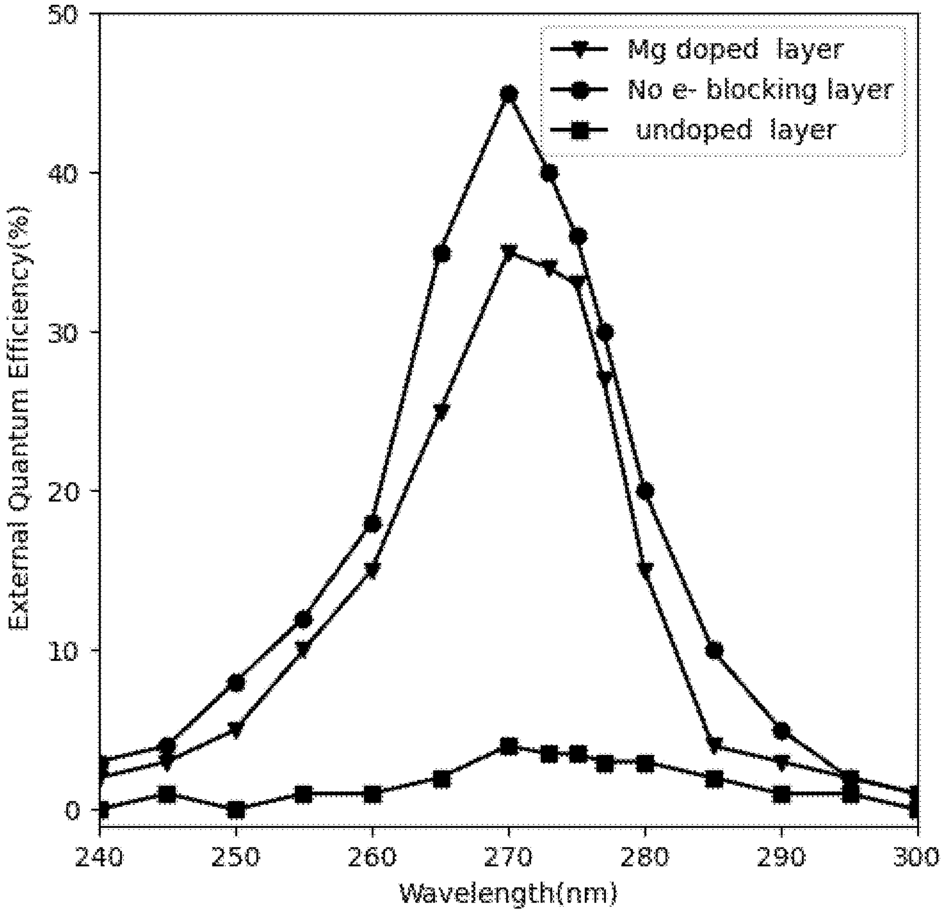
FIG. 6 is a simplified illustration of an external efficiency verses a wavelength range for a solar blind photodetector device showing selective detection in the solar blind region (<285 nm) according to an example of the present invention.

FIG. 6 is a simplified illustration of an external efficiency verses a wavelength range for a solar blind photodetector device showing selective detection in the solar blind region (<285 nm) according to an example of the present invention. As shown, an insertion of an undoped electron blocking layer resulted in a sharp drop in the device performance as indicated from its maximum external quantum efficiency in the UV spectral response was only of 4.10%. When the electron blocking layer was doped with Mg it increased to 35.2%. Regardless, the largest improvement in the external quantum efficiency was obtained when the electron blocking layer was taken out completely, where a maximum external quantum efficiency 44.9% was obtained.

Figure 7:
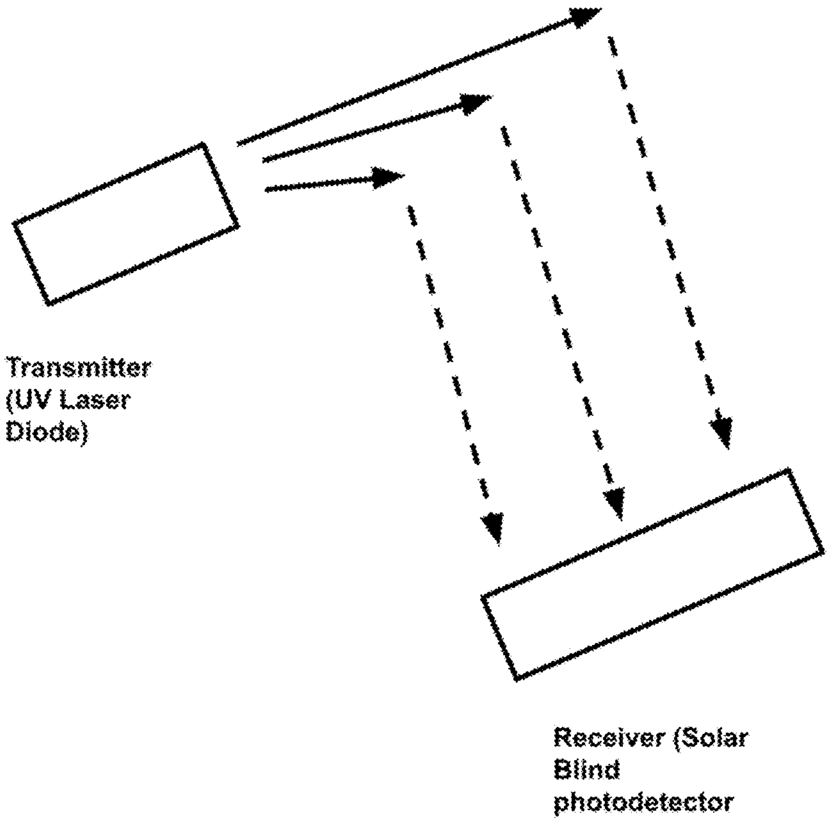
FIG. 7 is a simplified diagram of an illustration a solar blind light-fidelity (LiFI) communication system using a UV laser diode and solar blind photo detector device according to an example of the invention.

FIG. 7 is a simplified diagram of an illustration a solar blind light-fidelity (LiFI) communication system using a UV laser diode and solar blind photo detector device according to an example of the invention. In an example, Li-Fi, or Light Fidelity, is a wireless communication technology that uses light waves instead of radio waves to transmit data. In a Li-Fi system that uses a solar blind photodetector and a UV laser source, various components are included. In an example, a solar blind photodetector device is included. The detector is sensitive only to light in the UV range, between 200 and 280 nm. The device converts incoming light into an electrical signal that can be processed and used for communication. In an example, a UV laser device is included. The device emits light in the UV range and is used to modulate the signal onto the light wave. The modulated light is then transmitted to the solar blind photodetector. In an example, the system has a modulation circuit. The circuit is used to encode data onto the light wave by varying the intensity of the UV laser source. The data can be transmitted using different modulation schemes, such as on-off keying (OOK) or pulse position modulation (PPM). The system also has a transmitter and a receiver. The transmitter is responsible for converting the modulated signal into light and transmitting it to the solar blind photodetector. The receiver is responsible for detecting the modulated signal using the solar blind photodetector and extracting the encoded data from the electrical signal. In an example, the present Li-Fi system that uses a solar blind photodetector and a UV laser source can offer high-speed data transmission with low interference, as UV light has a shorter wavelength and can be modulated faster and therefore can carry more information than radio waves.

In an example, the solar blind photodetector device is provided in a solar blind light communication system. The system has a laser light source device, e.g., blue, UV, and others. In an example, the system has an UV AlGaN containing laser diode device configured to emit electromagnetic radiation having a wavelength shorter than 285 nm, the laser diode device. The device has a substrate member comprising a sapphire, silicon, silicon carbide, gallium and nitride containing substrate member, the substrate comprising a front side region and a backside region, an n-type gallium nitride containing cladding material overlying the front side region of the substrate member, and a plurality of quantum well regions overlying the n-type gallium nitride containing cladding material. In an example, the plurality of quantum well regions comprise at least a first quantum well region and a second quantum region. In an example, the device has an electron blocking material overlying the plurality of quantum well regions, a p-type gallium and nitride containing cladding material overlying the quantum well regions and a contact region overlying the p-type gallium and nitrogen cladding material.

In example of a laser device and related system can be found at previously mentioned, U.S. Ser. No. 18/300,332 filed Apr. 13, 2023 titled "COMPACT ULTRA-VIOLET LASER DIODE CONFIGURED FOR LIDAR SYSTEM FOR AIR TURBULENCE DETECTION", commonly assigned, and hereby incorporated by reference in its entirety.

Figure 8:
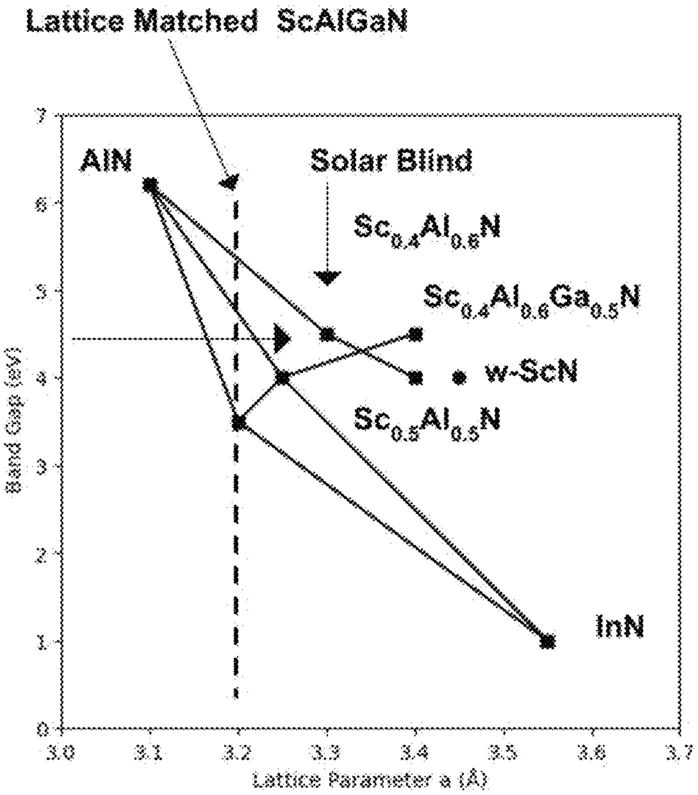
FIG. 8 is a simplified diagram illustrating energy bandages of the AlGaScN alloys versus lattice constant according to an example of the present invention.

FIG. 8 is a simplified diagram illustrating energy bandages of the AlGaScN alloys versus lattice constant according to an example of the present invention. As shown, all of the materials including allows can be configured as solar blind above a bandgap of 4.5 eV. All of the materials along the dashed line from the GaN point vertical to the AlScN alloy line are latticed matched to GaN substrates in preferred examples. By way of the latticed matching leading to reduction of imperfections and defects, the present invention has achieved a compact solar blind photodetector having improved features.

In an example, the present techniques include a step graded composition of AlGaScN or other variations to reduce a voltage spike near an interface. In an example, scandium is preferably included and configured to cause a lattice match at an interface region. In a preferred example, scandium is introduced using a scandium containing material, e.g., cyclopentane scandium, CP3 scandium, as a source for a transition metal in Group III, and introduced using bubbler configuration in replacement of a magnesium species, for example, and mixed before introduction into a reactor for deposition of AlGaScN material.

In an example, the aluminum gallium scandium and nitrogen material has a scandium to aluminum ratio of 0.4 to 0.5 scandium and 0.6 to 0.5 aluminum (or any variations thereof) such that a presence of a scandium entity is configured to form a lattice match at an interface region of the intrinsic light detection region and either the second compositionally graded AlGaN containing interconnecting material and/or the first compositionally graded AlGaN containing interconnecting material. That is, the presence of a scandium entity facilitates lattice matching, which reduces defects, e.g., cracks, imperfections, and improves device performance.

In an example, the solar blind AlGaN containing photodiode device is monolithically integrated. In an example, the first compositionally graded AlGaN containing interconnecting material and the n-type aluminum and gallium nitride containing cladding material are lattice matched, without substantial defects. In an example, the first compositionally graded AlGaN containing interconnecting material and the intrinsic light detecting region are latticed matched without substantial defects. In an example, the intrinsic light detecting region and the second compositionally graded AlGaN containing interconnecting material are latticed matched without substantial defects. In an example, the second compositionally graded AlGaN containing interconnecting material and the p-type aluminum and gallium nitride containing cladding material are latticed matched without substantial defects.

In an example, the device is characterized by an external quantum efficiency of at least 30 percent or at least 40 percent higher than the device configured an electron blocking region.

In an example, the solar blind AlGaN photodiode device is monolithically integrated into a focal plane array. In an example, the solar blind AlGaN containing photodiode device is monolithically integrated. In an example, the solar blind AlGaN photodiode device is monolithically integrated into a focal plane array. In an example, the solar blind AlGaN photodiode device is configured to receive a solar blind UV light signal scattered from a surface or an atmosphere from electromagnetic radiation from the laser light source device without interference with solar radiation.

In an example, the solar blind AlGaN photodiode device is encrypted with a unique identifier to receive information only from the laser light source device. In an example, the laser light source has a beam that is configured with a modulation representing a unique identifier. Such identifier is captured from the photodiode, which transfers information regarding the identifier to a processing device. The processing device identifies the unique identifier, and allows receipt of further information from the laser light source. In an example, the identifier serves as a unique key to allow the photodiode to continue to receive and transmit information from the laser light source.

In an example, the defect reducing nucleation or buffer material comprises an aluminum nitride material. In an example, the aperture region is characterized by a dimension of 1 micron to 100 microns.

In an example, the solar blind AlGaN photodiode device is operably in an avalanche mode. In an example, the solar blind photodiode operating in avalanche mode is a type of photodiode that is designed to detect ultraviolet light in the range of 200-280 nanometers, for example. In avalanche mode, the photodiode operates with a high reverse bias voltage. When a photon of UV light enters the depletion region of the photodiode, it generates an electron-hole pair. The carriers are accelerated by the high electric field in the depletion region and can trigger a chain reaction called avalanche multiplication. The carriers gain enough energy to create additional electron-hole pairs, which in turn create more pairs, leading to a large number of carriers being generated in a short amount of time. This creates a large current pulse that can be detected and amplified by the photodiode circuitry. In an example, the avalanche multiplication process improves the sensitivity and speed of the photodiode. However, it may also introduce noise and can lead to thermal runaway if the bias voltage is too high. To prevent this, avalanche photodiodes are typically operated at a voltage just below the breakdown voltage, where the avalanche multiplication is still significant but the noise and thermal effects are minimized. In an example, the UV solar blind photodiode operating in avalanche mode is a highly sensitive and fast detector of UV radiation that is useful in applications such as flame detection, UV curing, and scientific research, and other applications.

In an example, the solar blind device can be packaged in a variety of packaging designs. In an example, the device is configured in a TO-can package configured for the solar blind AlGaN photodiode device.

In an example, the device is characterized by an external quantum efficiency of at least 30 percent and higher or at least 40 percent and higher than the device configured with an electron blocking region, the device is configured without an electron blocking region.

In an example, the present invention provides a solar blind light AlGaN photodetector device configured to detect electromagnetic radiation having a wavelength shorter than 285 nm. The device has a substrate member comprising a sapphire, silicon, silicon carbide, gallium and nitride containing substrate member, the substrate member having a backside region and a frontside region. The device has an aperture region configured from the backside region, the aperture region being transparent to electromagnetic radiation ranging in wavelength from less than 280 nanometers.

In an example, the device has a defect reducing nucleation or buffer material overlying the frontside region of the substrate member to reduce or eliminate substantial defects, e.g., cracks, dislocations, in an overlying crystalline material. In an example, the device has an n-type aluminum and gallium nitride containing cladding material overlying the defect reducing nucleation or buffer material overlying the frontside region of the substrate member. The device has a first compositionally graded AlGaN containing interconnecting material overlying the n-type aluminum and gallium nitride containing cladding material and characterized by an aluminum to gallium ratio (or fraction) ranging from 1 to 0.60 at a first interface between the first compositionally graded AlGaN containing interconnecting material and the n-type aluminum and gallium nitride containing cladding material and grading to a ratio ranging from 0.45 to 0.55 aluminum to gallium at a second interface. Other ranges can also be used.

In an example, the device has an intrinsic light detecting region having a bandgap of larger than 4.35 eV and being undoped. The intrinsic light detecting region ranges in thickness from 100 nanometers to 1 micron or greater overlying the second interface of the first compositionally graded AlGaN containing interconnecting material. The intrinsic light detecting region comprises an aluminum gallium scandium nitride material and having a constant ratio of aluminum to gallium ranging from 0.45 to 0.55.

In an example, the device has a second compositionally graded AlGaN containing interconnecting material overlying the intrinsic light detecting region and having an aluminum to gallium ratio ranging from 0.45 to 1 at a first interface between the second compositionally graded AlGaN containing material and the intrinsic light detecting region and grading to a ratio ranging from 1 to 0.60 at a second interface.

In an example, the device has a p-type aluminum and gallium nitride containing cladding material overlying the second interface of the intrinsic light detecting region. In an example, a contact region is formed overlying the p-type gallium and nitrogen cladding material.

In an example, the device has a signal to noise ratio of greater than 100 to 1 characterizing the device such that an electromagnetic radiation received by the aperture region being free from interference with solar radiation. The device has an operating temperature range of 10 Degrees Kelvin to 500 Degrees Kelvin characterizing the device and an optical lens material overlying the aperture region.

In an example, the first interface between the first compositionally graded AlGaN containing interconnecting material and the n-type aluminum and gallium nitride containing cladding material is lattice matched. The second interface between the first compositionally graded AlGaN containing interconnecting material and the intrinsic light detecting region is latticed matched. The first interface between the intrinsic light detecting region and the second compositionally graded AlGaN containing interconnecting material is latticed matched. The second interface between the second compositionally graded AlGaN containing interconnecting material and the p-type aluminum and gallium nitride containing cladding material is latticed matched. In an example, the latticed matched interface is preferably free from defects although there can be non-material defects to form an efficiently functioning device.

While the above is a full description of the specific examples, various modifications, alternative constructions, and equivalents may be used. As an example, the packaged device can include any combination of elements described above, as well as outside of the present specification. In an example, the various ranges or parameters can be modified or altered without departing from the invention. In a preferred example, the solar blind photodetector is advantageously combined with a UV laser device in a communication system, e.g., LiFi, LiDAR, to enable solar blind communications, range finding, and other detection techniques. Therefore, the above description and illustrations should not be taken as limiting the scope of the present invention which is defined by the appended claims.

What is claimed is:

1. A solar blind light AlGaN photodetector device configured to detect electromagnetic radiation having a wavelength shorter than 285 nm, the device comprising:

a substrate member selected from at least one of a sapphire, a silicon, a silicon carbide, or a gallium and nitride containing substrate member, the substrate member having a backside region and a frontside region;

an aperture region configured from the backside region, the aperture region being transparent to electromagnetic radiation ranging in wavelength that is less than 280 nanometers;

a defect reducing nucleation material or buffer material overlying the frontside region of the substrate member;

an n-type aluminum and gallium nitride containing cladding material overlying the defect reducing nucleation material or buffer material overlying the frontside region of the substrate member;

a first compositionally graded AlGaN containing interconnecting material overlying the n-type aluminum and gallium nitride containing cladding material;

an intrinsic light detecting region having a bandgap of larger than 4.35 eV corresponding to detect electromagnetic radiation less than a wavelength of 285 nm, the intrinsic light detecting region ranging in thickness from 100 nanometers or greater overlying the first compositionally graded AlGaN containing interconnecting material, the intrinsic light detecting region comprising an aluminum gallium scandium nitride material such that the aluminum gallium scandium and nitrogen material characterizing the intrinsic light detection region;

an undoped region characterizing the intrinsic light detecting region;

a second compositionally graded AlGaN containing interconnecting material overlying the intrinsic light detecting region;

a p-type aluminum and gallium nitride containing cladding material overlying the intrinsic light detecting region;

a contact region overlying the p-type gallium and nitrogen cladding material;

a signal to noise ratio characterizing the device;

an operating temperature range of 10 Degrees Kelvin to 500 Degrees Kelvin characterizing the device; and an optical lens material overlying the aperture region.

2. The device of claim 1 is provided in a solar blind light communication system comprising:

a laser light source device comprising:

an UV AlGaN containing laser diode device configured to emit electromagnetic radiation having a wavelength shorter than 285 nm, the laser diode device comprising:

a substrate member comprising at least one of a sapphire, a silicon, a silicon carbide, or a gallium and nitride containing substate member, the substrate comprising a front side region and a backside region;

an n-type gallium nitride containing cladding material overlying the front side region of the substrate member;

a plurality of quantum well regions overlying the n-type gallium nitride containing cladding material, the plurality of quantum well regions comprising at least a first quantum well region and a second quantum region;

an electron blocking material overlying the plurality of quantum well regions;

a p-type gallium and nitride containing cladding material overlying the quantum well regions; and a contact region overlying the p-type gallium and nitrogen cladding material.

3. The device of claim 1 wherein the solar blind AlGaN containing photodiode device is monolithically integrated; and wherein the first compositionally graded AlGaN containing interconnecting material and the n-type aluminum and gallium nitride containing cladding material are lattice matched; wherein the first compositionally graded AlGaN containing interconnecting material and the intrinsic light detecting region are latticed matched; wherein the intrinsic light detecting region and the second compositionally graded AlGaN containing interconnecting material are latticed matched; and wherein the second compositionally graded AlGaN containing interconnecting material and the p-type aluminum and gallium nitride containing cladding material are latticed matched; and further comprising an external quantum efficiency of at least 30 percent or at least 40 percent higher than the device configured an electron blocking region.

4. The device in claim 1 wherein the solar blind AlGaN photodiode device is monolithically integrated into a focal plane array; wherein the aluminum gallium scandium and nitrogen material having a scandium to aluminum ratio of 0.4 to 0.5 scandium and 0.6 to 0.5 aluminum such that a presence of a scandium entity is configured to form a lattice match at an interface region of the intrinsic light detection region and either the second compositionally graded AlGaN containing interconnecting material and/or the first compositionally graded AlGaN containing interconnecting material.

5. The device of claim 1 wherein the solar blind AlGaN containing photodiode device is monolithically integrated; and wherein the solar blind AlGaN photodiode device is monolithically integrated into a focal plane array.

6. The device of claim 1 wherein the solar blind AlGaN photodiode device is configured to receive a solar blind UV light signal scattered from a surface or an atmosphere from electromagnetic radiation from the laser light source device.

7. The device of claim 1 wherein the solar blind AlGaN photodiode device is encrypted with a unique identifier to receive information only from the laser light source device.

8. The device of claim 1 wherein the defect reducing nucleation or buffer material comprises an aluminum nitride material.

9. The device of claim 1 wherein the aperture region is characterized by a dimension of 1 micron to 100 microns.

10. The device of claim 1 wherein the solar blind AlGaN photodiode device is operably in an avalanche mode and is operable at a voltage below a breakdown voltage of the solar blind AlGaN photodiode device to be free from interference noise.

11. The device of claim 1 further comprising a TO-can package configured for the solar blind AlGaN photodiode device.

12. The device of claim 1 wherein the device is characterized by an external quantum efficiency of at least 30 percent or at least 40 percent higher than the device configured with an electron blocking region, the device is configured without an electron blocking region.

13. A method of fabricating a solar blind light AlGaN photodetector device configured to detect electromagnetic radiation having a wavelength less than 285 nm, the method comprising:

providing a substrate member comprising at least one of a sapphire, a silicon, a silicon carbide, or a gallium and nitride containing substrate member, the substrate member having a backside region and a frontside region such that the backside is configured as an aperture region, the aperture region being transparent to electromagnetic radiation ranging in wavelength less than 280 nanometers;

forming a defect reducing nucleation or buffer material using a MOCVD Process in which the group III gaseous precursor is introduced before the group V precursor process overlying the frontside region of the substrate member, the defect reducing nucleation or buffer material comprising an AlN material having a thickness ranging from 1 nm to 20 nm;

forming an n-type aluminum and gallium nitride containing cladding material overlying the defect reducing nucleation or buffer material overlying the frontside region of the substrate member, the n-type aluminum and gallium nitride containing cladding material comprising a silicon or germanium dopant having a concentration ranging from 1E+16 cm-3 to 1E+20 cm-3 and a thickness ranging from 10 nm to 5000 nm;

forming a first compositionally graded AlGaN containing interconnecting material using a MOCVD process at a temperature ranging from 800 C to 1400 C overlying the n-type aluminum and gallium nitride containing cladding material having an aluminum composition ranging from 90% to 60% from an initial region to a final region, and a thickness ranging from 1 nm to 50 nm;

forming an intrinsic light detecting region using a MOCVD process at a temperature ranging from 800 C to 1400 C having a bandgap of larger than 4.35 eV for detecting electromagnetic radiation having a wavelength shorter than a 285 nm wavelength range, the intrinsic light detecting region ranging in thickness from 100 nanometers to 1 micron or greater overlying the first compositionally graded AlGaN containing interconnecting material, the intrinsic light detecting region comprising an aluminum gallium scandium nitride material and configured with an undoped region characterizing the intrinsic light detecting region;

forming a second compositionally graded AlGaN containing interconnecting material using a MOCVD process having a temperature ranging from 800 C to 1400 C overlying the intrinsic light detecting region and having a composition of aluminum ranging from 65% to 0% from an initial region to a final region, and a thickness ranging from 1 nm to 50 nm;

forming a p-type gallium nitride containing cladding material using a MOCVD process having a temperature of 800 C to 1400 C overlying the intrinsic light detecting region, the p-type aluminum and gallium nitride containing cladding material comprising a p-type dopant having a concentration ranging from 1E+16 cm-3 to 2E+20 cm-3, and a thickness ranging from 1 nm to 100 nm;

forming a contact region overlying the p-type gallium and nitrogen cladding material, the contact region comprising a MOCVD deposited material having a dopant of p-type at a concentration ranging from 1E+16 cm-3 to 2E+20 cm-3, and a thickness ranging from 1 nm to 100 nm; and coupling an optical lens material comprising an inorganic material overlying the aperture region and having a transparency of 25% and greater for a wavelength ranging from 285 nm to 250 nm.

14. The method of claim 13 wherein the solar blind AlGaN containing photodiode device is monolithically integrated; and wherein the solar blind AlGaN photodiode device is monolithically integrated into a focal plane array.

15. The method of claim 13 wherein the solar blind AlGaN photodiode device is encrypted with a unique identifier to receive information only from the laser light source device.

16. The method of claim 13 wherein the defect reducing nucleation or buffer material comprises an aluminum nitride material.

17. The method of claim 13 wherein the aperture region is characterized by a dimension of 1 micron to 100 microns.

18. The method of claim 13 wherein the solar blind AlGaN photodiode device is operably in an avalanche mode; wherein the device is characterized by an external quantum efficiency of at least 30 percent or at least 40 percent and is configured without an electron blocking region.

19. A solar blind light AlGaN photodetector device configured to detect electromagnetic radiation having a wavelength shorter than 285 nm, the device comprising:

a substrate member comprising at least one of a sapphire, a silicon, a silicon carbide, or a gallium and nitride containing substrate member, the substrate member having a backside region and a frontside region;

an aperture region configured from the backside region, the aperture region being transparent to electromagnetic radiation ranging in wavelength from less than 280 nanometers;

a defect reducing nucleation or buffer material overlying the frontside region of the substrate member;

an n-type aluminum and gallium nitride containing cladding material overlying the defect reducing nucleation or buffer material overlying the frontside region of the substrate member;

a first compositionally graded AlGaN containing interconnecting material overlying the n-type aluminum and gallium nitride containing cladding material and characterized by an aluminum to gallium ratio ranging from 1 to 0.60 at a first interface between the first compositionally graded AlGaN containing interconnecting material and the n-type aluminum and gallium nitride containing cladding material and grading to a ratio (Al:Ga) ranging from 0.45:55 to 0.55:45 aluminum to gallium at a second interface;

an intrinsic light detecting region having a bandgap of larger than 4.35 eV and being undoped, the intrinsic light detecting region ranging in thickness from 100 nanometers to 1 micron or greater overlying the second interface of the first compositionally graded AlGaN containing interconnecting material, the intrinsic light detecting region comprising an aluminum gallium scandium nitride material and having a constant ratio of aluminum to gallium ranging from 0.45:55 to 0.55:45;

a second compositionally graded AlGaN containing interconnecting material overlying the intrinsic light detecting region and having an aluminum to gallium ratio ranging from 0.45:0.55 to 1:0 at a first interface between the second compositionally graded AlGaN containing material and the intrinsic light detecting region and grading to a ratio ranging from 1:0 to 0.60:0.40 at a second interface;

a p-type aluminum and gallium nitride containing cladding material overlying the second interface of the intrinsic light detecting region;

a contact region overlying the p-type gallium and nitrogen cladding material;

a signal to noise ratio of greater than 100 to 1 characterizing the device such that an electromagnetic radiation received by the aperture region being free from interference with solar radiation;

an operating temperature range of 10 Degrees Kelvin to 500 Degrees Kelvin characterizing the device; and an optical lens material overlying the aperture region.

20. The device of claim 19 wherein the first interface between the first compositionally graded AlGaN containing interconnecting material and the n-type aluminum and gallium nitride containing cladding material is lattice matched; wherein the second interface between the first compositionally graded AlGaN containing interconnecting material and the intrinsic light detecting region is latticed matched; wherein the first interface between the intrinsic light detecting region and the second compositionally graded AlGaN containing interconnecting material is latticed matched; and wherein the second interface between the second compositionally graded AlGaN containing interconnecting material and the p-type aluminum and gallium nitride containing cladding material is latticed matched; and further comprising an external quantum efficiency.

* * * * *